United States Patent [19]

Beyer et al.

[11] Patent Number: 5,134,637
[45] Date of Patent: Jul. 28, 1992

[54] CLOCK RECOVERY ENHANCEMENT CIRCUIT

[75] Inventors: Donald R. Beyer, Bartlett; John P. Monson, Palatine, both of Ill.

[73] Assignee: Motorola, Inc., Schaumburg, Ill.

[21] Appl. No.: 674,816

[22] Filed: Mar. 22, 1991

[51] Int. Cl.$^5$ .............................................. H03D 3/24
[52] U.S. Cl. ..................................... 375/119; 307/269; 328/63
[58] Field of Search ............... 375/110, 118, 119, 120; 307/208, 269; 328/63, 72, 61, 73, 155; 360/51

[56] References Cited

U.S. PATENT DOCUMENTS 4,280,099 7/1981 Rattlingourd et al. ............ 375/119
4,357,707 11/1982 Delury ............................. 375/110
4,841,167 6/1989 Saegusa ............................ 307/269

Primary Examiner—Stephen Chin
Attorney, Agent, or Firm—Wayne J. Egan

[57] ABSTRACT

An improved clock recovery enhancement circuit is provided that is particularly adapted for solving the problem caused by an incoming signal that is asymmetric and comprises a sub-harmonic tone of the bit rate clock, that is 180° out of phase with the recovering clock, thereby causing the data edges to appear to be locked. The clock recovery enhancement circuit, according to the invention, provides a window signal near a predefined edge of the recovering clock which creates a disable signal such that clock adjustments may be biased towards one direction.

12 Claims, 6 Drawing Sheets

CLOCK RECOVERY ENHANCEMENT CIRCUIT

TECHNICAL FIELD

This application relates to a method and apparatus for data clock recovery.

BACKGROUND OF THE INVENTION

The purpose of clock recovery is to lock the bit rate clock to the incoming signal in such a way that the falling edge of the recovered clock is aligned with the edges of the data. This allows the signal to be sampled in the middle of the bit with the rising edge of the recovered clock. This is accomplished by comparing data edges to the falling edge of the recovering clock. If a data edge occurs before the falling edge of the clock, the edge is considered early and the recovered clock is accelerated, as shown in FIG. 1. If the data edge occurs after the falling edge of clock, the edge is considered late and the recovered clock is retarded, as shown in FIG. 2.

When an incoming signal is asymmetric and a subharmonic tone of the bit rate clock, and is 180° out of phase with the recovering clock, undesired clock correction can occur, thereby causing undesired clock lock. The data edges will cause a sequence of alternating early-late adjustments in the clock recovery circuit, and the clock will appear to be locked. This is shown in FIG. 3.

It is apparent, therefore, that there is a need for an improved clock recovery circuit.

SUMMARY OF THE INVENTION

The inventors have discovered that the foregoing problem is substantially solved by the introduction of a window signal near the rising edge of the recovering clock such that clock adjustments may be biased towards one direction.

Briefly, a clock recovery circuit, according to the invention, detects successive data edges of the data signal and, for each data edge detected, determines whether the data edge is early or late with respect to the corresponding edge of the recovered clock signal. If the data edge is early, then the circuit accelerates the recovered clock signal by a recovery adjustment unit of time. If the data edge is late, the circuit retards the recovered clock signal by a like amount of time.

For each recovered clock signal edge, the clock recovery enhancement circuit generates a window signal of a predetermined time duration. The circuit then detects when a data edge occurs during the duration of the window signal.

When this occurs (data edge during the window), then the enhancement circuit determines:

(i) whether the next edge is late or early with respect to the corresponding edge of the recovered clock signal; and, (ii) whether the late/early condition so determined is opposite to the late/early condition determined for the earlier or preceding data edge.

When this occurs (opposite late/early condition with respect to that of preceding data edge), the accelerating or retarding step that normally would have occurred is disabled.

The predetermined time duration of the window signal may be adjusted to a value greater than the clock recovery adjustment unit of time, but less than one-half the period of the data rate $f_d$, minus one clock recovery adjustment unit.

BRIEF DESCRIPTION OF THE DRAWINGS

FIGS. 9-1 and 9-2 depict a specific embodiment of the late edge accumulator (element 441) and the early edge accumulator (element 451) of the first embodiment depicted in FIG. 4. There is also shown a further embodiment of the window generator 413 and the window edge comparator 417.

DETAILED DESCRIPTION OF THE INVENTION

Figure 4:
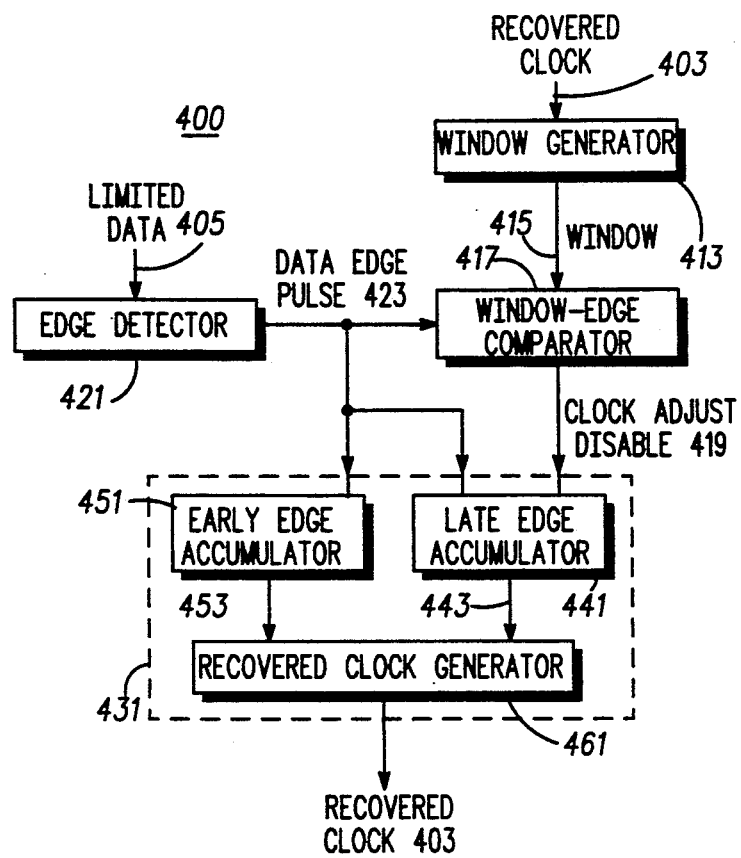
FIG. 4 is a block diagram of a first embodiment of a clock recovery enhancement circuit, according to the invention. As shown, this first embodiment includes a window generator, element 413, a window-edge comparator, element 417, a late edge accumulator, element 441, an early edge accumulator, element 451, and a recovered clock generator, element 461.

Referring now to FIG. 4, there is shown a first embodiment of a clock recovery enhancement circuit, according to the invention.

The clock recovery enhancement circuit, according to the invention, adds a window signal 415 with two aspects that must be considered. The window signal 415 will have a minimum width and a maximum width associated with it. The minimum width will be determined by the step size of the clock recovery 431. If the window signal 415 is not at least one step size wide, the data edge pulse 423 could possibly never fall within this window. The typical width will be determined by the asymmetry expected in the limited data signal 405.

From this window signal 415, a disable signal 419 will be generated only if a data edge falls within the duration of the window signal 419. The disable signal 419 lasts until the next edge of data. If the next edge falls in the next window, a new disable signal 419 will be generated, otherwise no diable signal 419 will be generated.

The clock recovery 431 attempts to adjust the recovered clock signal 403 such that the falling edge will be (in theory) perfectly aligned with the falling edges of the limited signal 405. It does this by means of an early accumulator 451, which acts to increase, or advance the frequency of the output recovered clock signal 403, and further by means of a late accumulator 441, which acts to decrease, or retard the frequency of the output recovered clock signal 403.

The disable signal 419 will inhibit the opposite accumulator in which the edge that caused the disable signal 419 was counted. Thus, referring now to the embodiment 400 depicted in FIG. 4, note that the clock adjust disable signal 419 is coupled to the late edge accumulator 441. As a result, if the data edge pulse signal 423 is early and within the duration of the window signal 415, then the disable signal 419 inhibits the late accumulator 441 for the succeeding edge.

Conversely, in an alternate embodiment (not shown), the clock adjust disable signal 419 may be coupled to the early edge accumulator 451 (instead of the late edge accumulator 441). As a result, in such an alternate embodiment, if the data edge pulse signal 423 is late and within the window, then the disable signal 419 inhibits the early accumulator 451 for the succeeding edge.

By inhibiting only the opposite accumulator, signals whose data edge pulses 423 always fall in the duration of the window signal 415 will not be prevented from locking correctly. This will in effect bias the clock recovery 431 accumulators in favor of the accumulator which is enabled. Once the recovered clock signal 403 has adjusted enough so that data edge signals 423 do not fall within the duration of the window signal 415, the disable signal 419 ceases to be generated and the clock recovery operates as it would without the enhancement, according to the invention. This is shown in FIG. 5, which is a timing diagram for FIG. 4.

Figure 5:
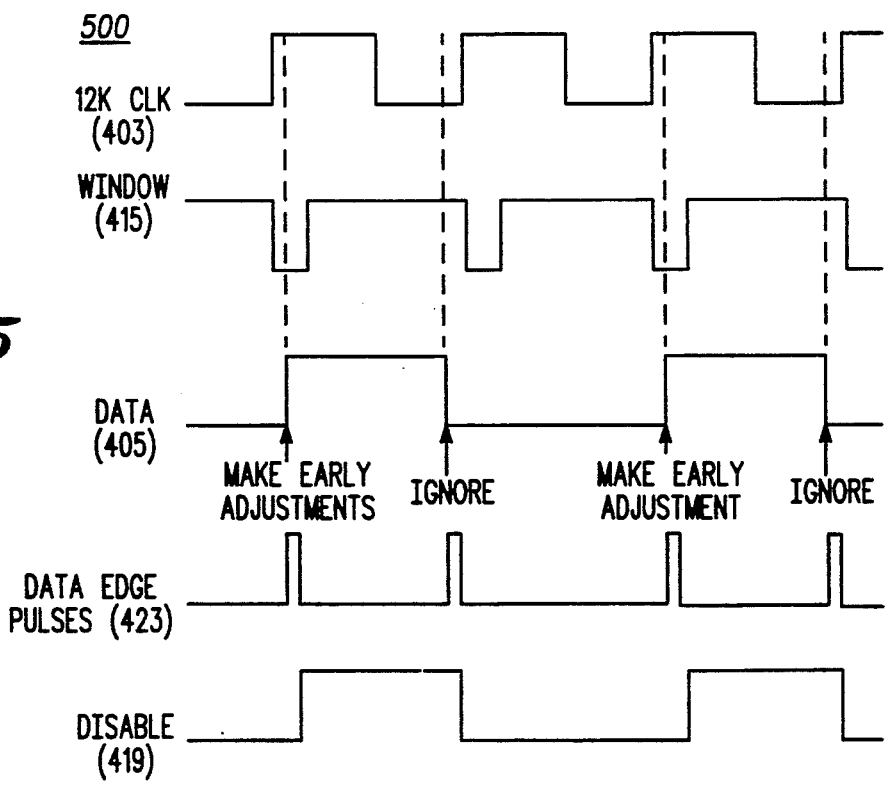
FIG. 5 is a timing diagram for FIG. 4.

Referring now to FIG. 5, it will be appreciated that the disable window designated (d) occurs in the early portion of the 12 KHz clock. Thus, if a data edge 423 occurs within the duration of the window signal, the late accumulator is disabled until a data edge occurs outside of the window. This results in a bias towards early adjustments if the signal is out of phase, with respect to the recovered clock.

Figure 6:
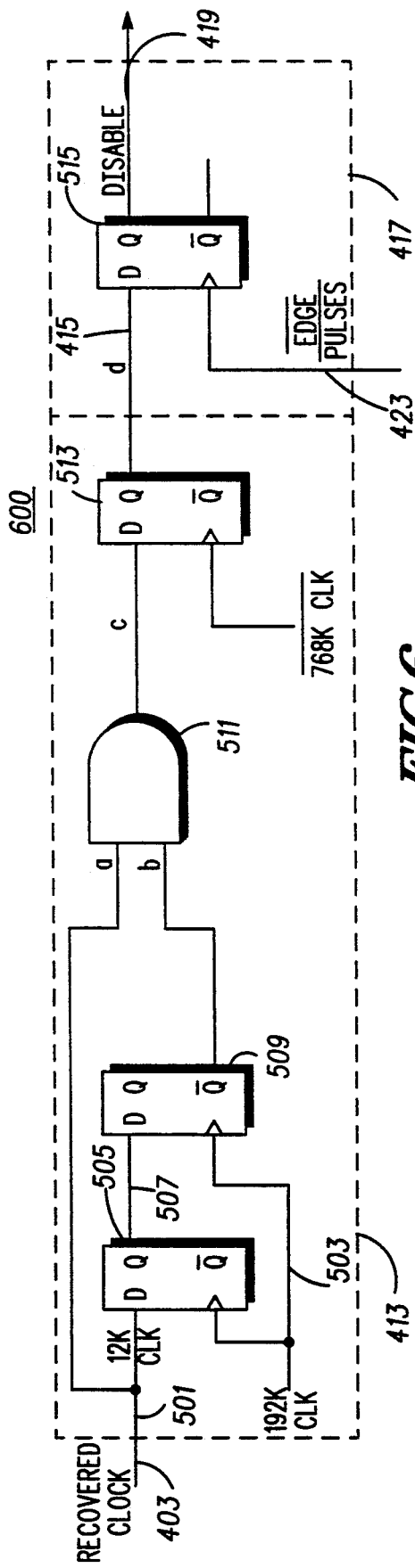
FIG. 6 depicts a specific embodiment of the window generator (element 413) and window-edge comparator (element 417) of the first embodiment depicted in FIG. 4.

Referring now to FIG. 6, there is shown a specific embodiment for certain elements of FIG. 4, in particular the window generator 413, and the window-edge comparator 417.

Note the window generator 413 comprises a first D-type flip flop 505, a second D-type flip flop 509, a third D-type flip flop 513, and an AND-type gate 511. In FIG. 6, it is assumed the recovered clock rate ($f_d$) is 12 KHz. Note that the window generator 413 depicted in FIG. 6 utilizes a first clock rate of 192 KHz that is a first multiple (16) of $f_d$, and a second clock rate 768 KHz that is a second multiple (64) of $f_d$. The window signal 415 (also designated d) is output from flip flop 513.

Note the window-edge comparator 417 comprises a D-type flip flop 515. The window signal 415 (also designated d) and the data edge pulse signal 423 are input to flip flop 515, and the clock adjust disable signal 419 is output from flip flop 515.

Figure 7:
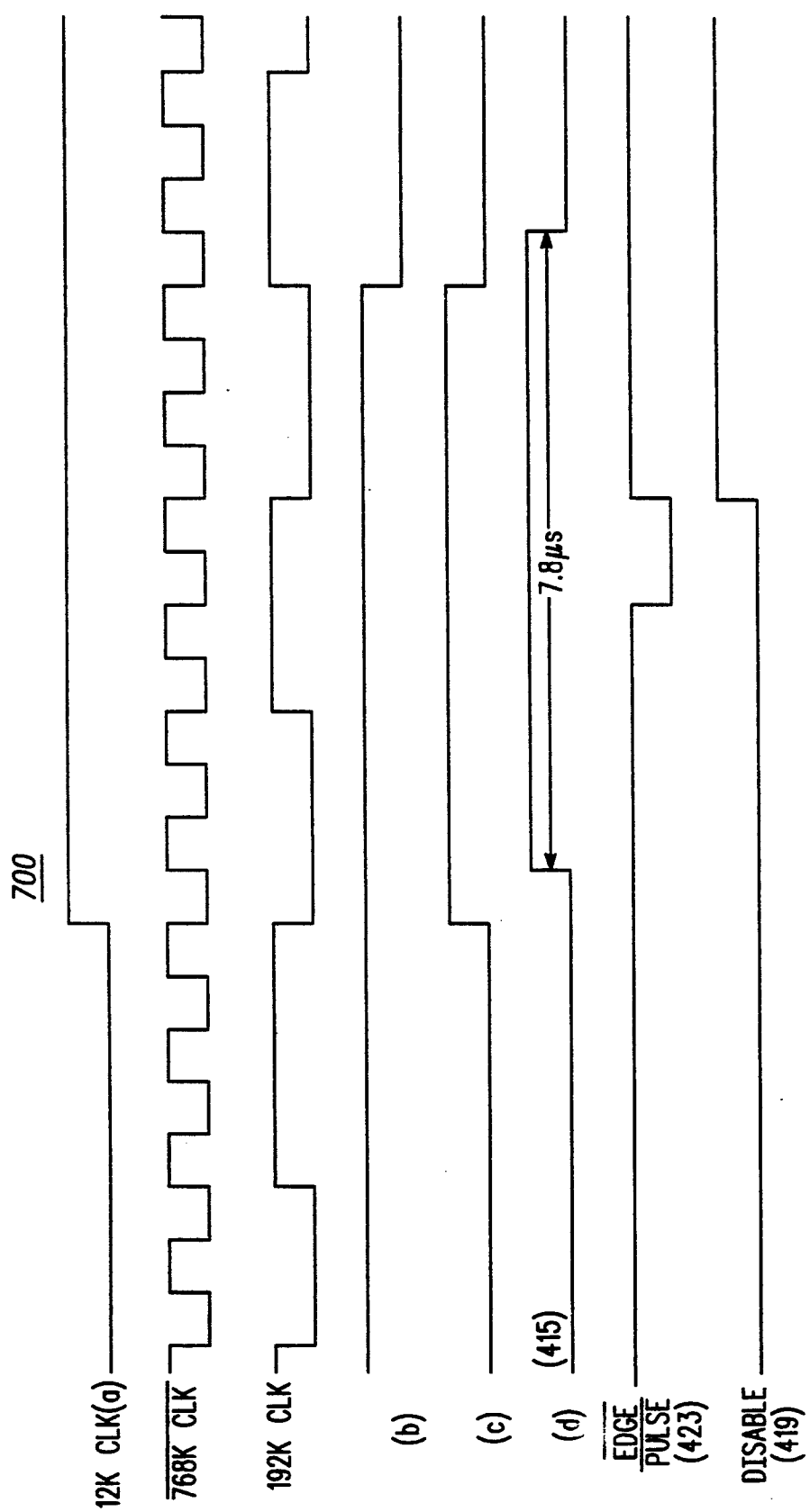
FIG. 7 is a timing diagram for FIG. 6.

FIG. 7 is a timing diagram for the specific embodiment depicted in FIG. 6. The window signal 415 is depicted as waveform (d). As mentioned above, in the embodiment of FIG. 6, the data rate is 12 KHz, and a first higher-speed clock of 192 KHz and a second higher-speed clock of 768 KHz are used to generate the window signal 415. In this embodiment, the duration of the window signal 415, depicted as waveform (d), was chosen to be 1.5 times the period of the 192 KHz clock, which is 7.8 micro-seconds, as shown.

The clock recovery apparatus used in prior art receivers has no prevention against locking on asymmetric sub-harmonics of the recovering clock.

One potential application of a clock recovery enhancement circuit, according to the invention, would be any data system that can be subjected to periodic signals such as, for example, general land mobile radios with mixed signalling.

Figure 8:
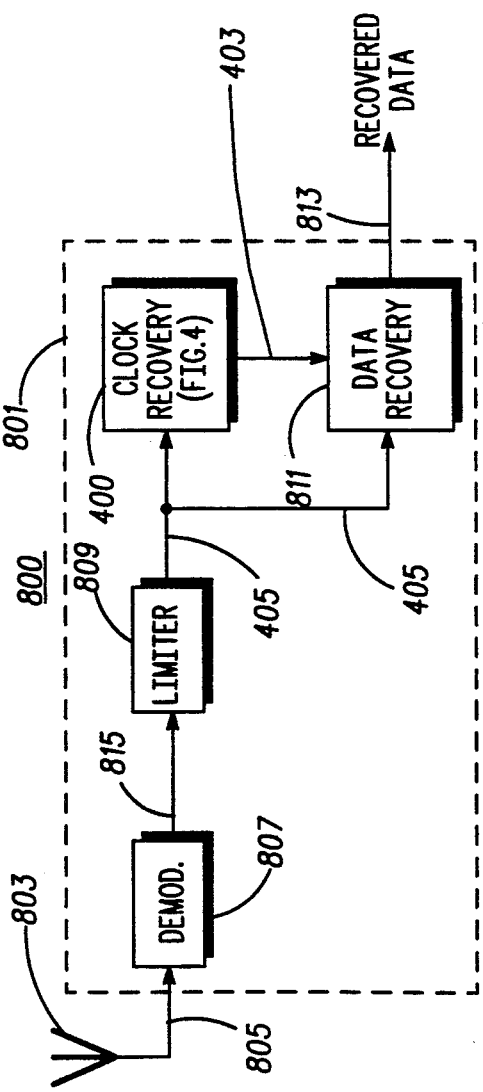
FIG. 8 is a block diagram showing a typical application for the invention. As shown, this application comprises an RF receiver equipped with a clock recovery enhancement circuit, according to the invention.

In FIG. 8 there is shown a particular application of the invention. There is shown a receiver 801 equipped with a first embodiment of a clock recovery circuit 400 which includes a clock recovery enhancement circuit, according to the invention, in accordance with FIG. 4. As shown, the receiver 801 is equipped with an antenna 803. The antenna 803 receives RF signals 805 and applies them to a demodulator 807. The received RF signal includes a stream of transmitted data at a predetermined data rate such as, for example, 12 KHz. The demodulator 807, in turn, forms a discriminated signal 815, and applies it to a limiter 809. The limiter 809, in turn, forms a limited data signal 405. The limited data signal 405 is then applied in parallel to the clock recovery circuit 400 and to a data recovery circuit 811. The clock recovery circuit 400 which includes the clock recovery enhancement circuit, as described hereinabove, forms a recovered clock signal 403 at the transmitted 12 KHz data rate which signal, in turn, is applied to the data recovery circuit 811. The data recovery circuit 811 may be, for example, a typical data recovery circuit as is known in the prior art. The data recovery circuit 811 utilizes the 12 KHz recovered clock signal 403 to recover the transmitted data, thereby forming an output recovered data signal 813.

Figure 1:
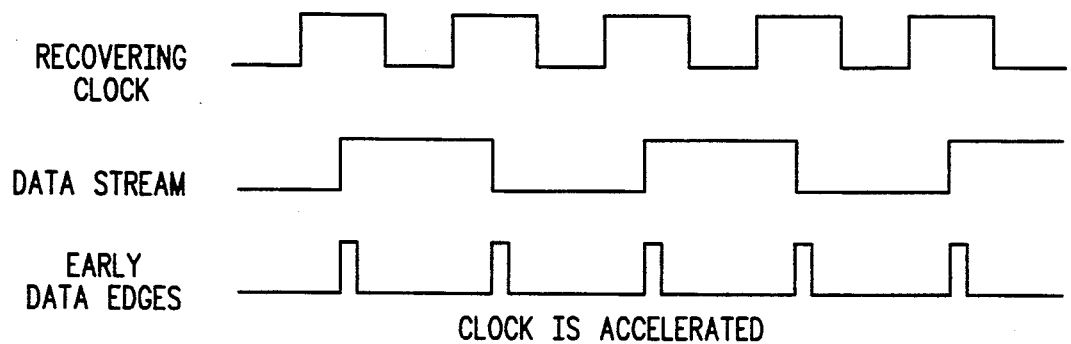
FIG. 1 is a timing diagram of clock recovery showing early data edge corrections, as in the prior art.
Figure 2:
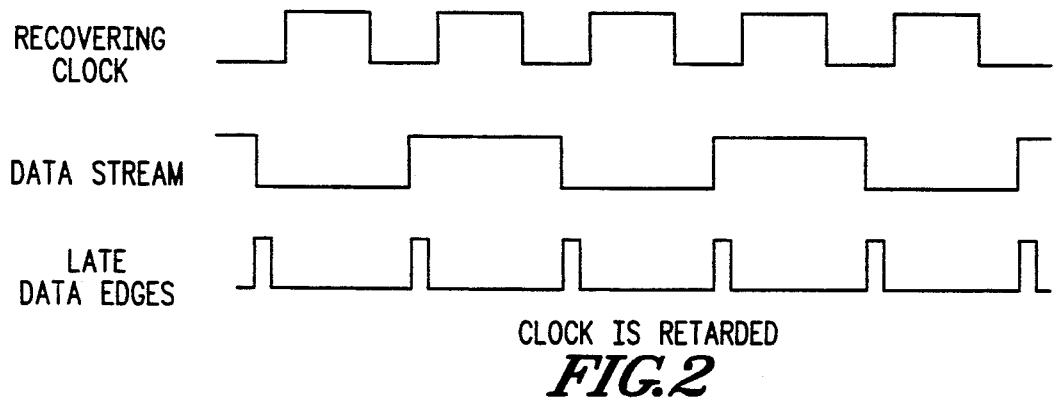
FIG. 2 is a timing diagram of clock recovery showing late data edge clock corrections, as in the prior art.
Figure 3:
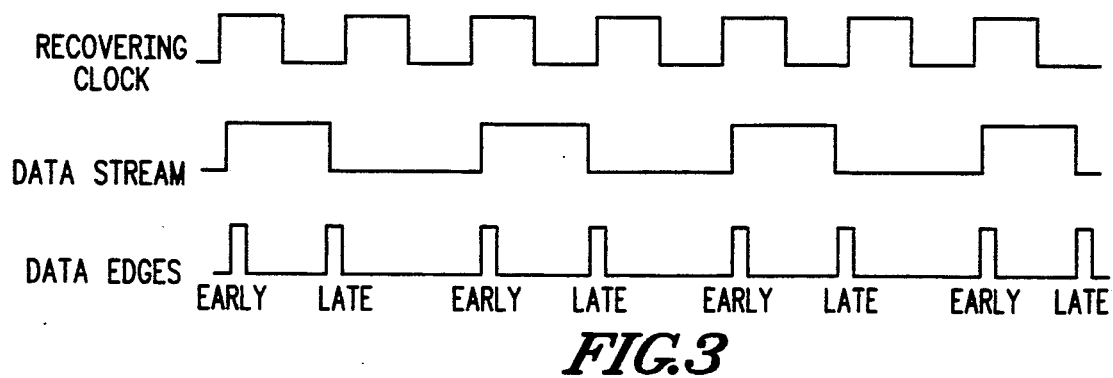
FIG. 3 is a timing diagram of an asymmetric data stream causing an undesired clock correction sequence.
Figures 1, 9:
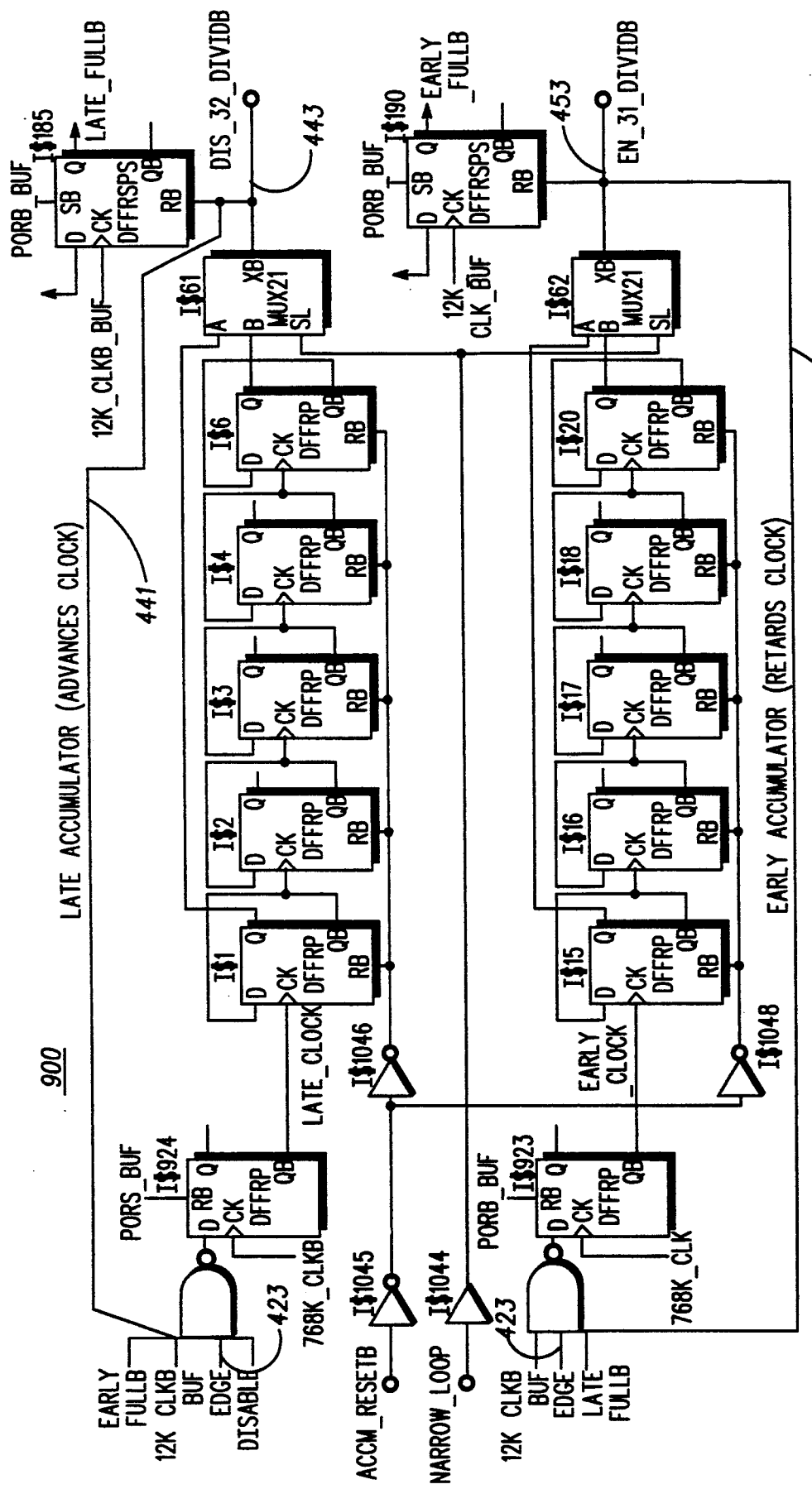
Figures 2, 9:
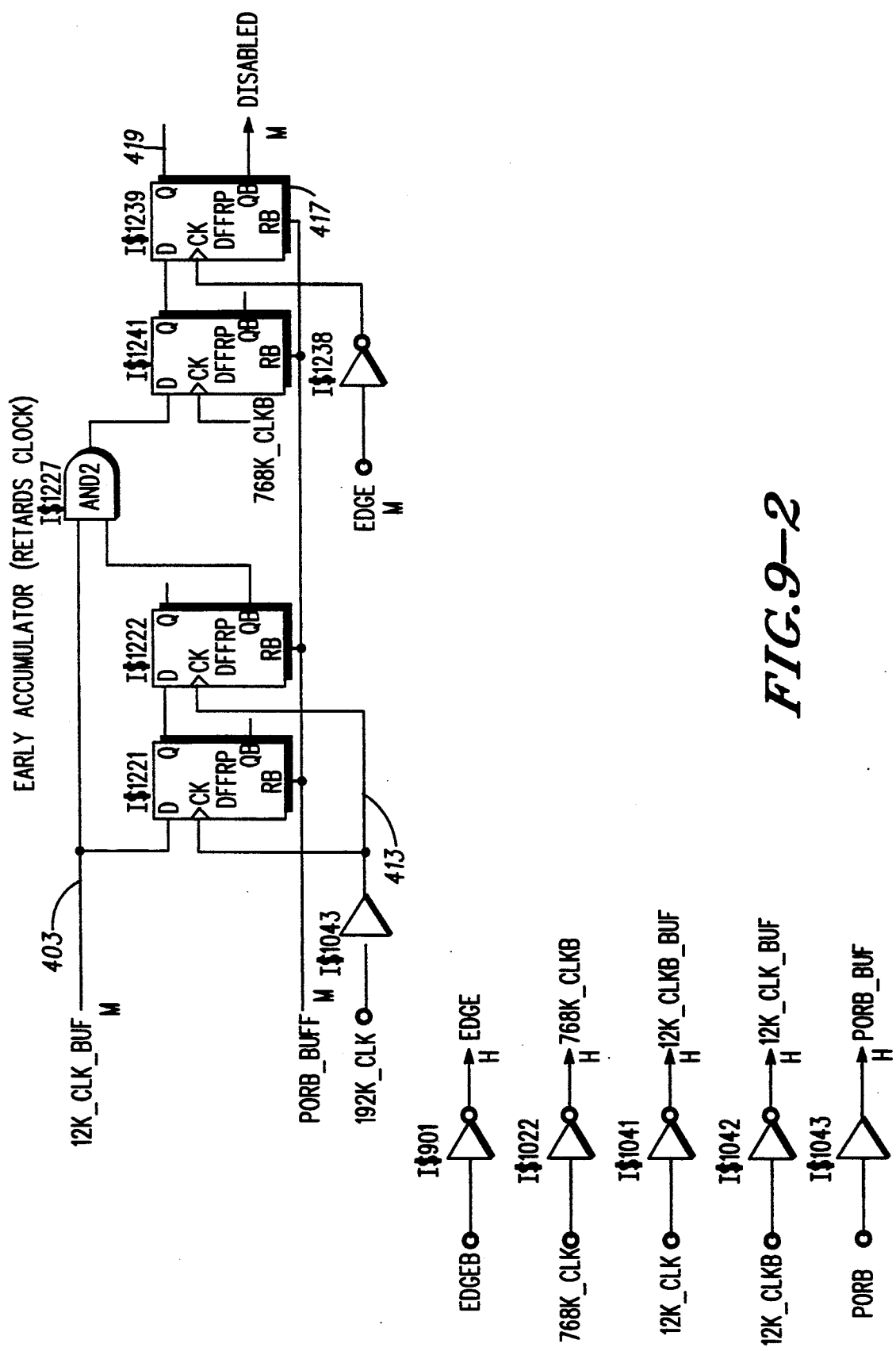

FIGS. 9-1 and 9-2 show a specific embodiment of the late edge accumulator (element 441) and the early edge accumulator (element 451) of the first embodiment depicted in FIG. 4. There is also shown a further embodiment of the window generator 413 and the window edge comparator 417.

While various embodiments shown herein, particularly those of FIGS. 6 and 9, are depicted as using discrete components, it will be apparent to those skilled in the art that any or all of the embodiments shown may be implemented, in part or in whole, by means of a suitably-programmed processor such as, for example, a digital signal processor (DSP).

In summary, it is obvious to one skilled in the art that the disclosed embodiments could be implemented, in whole or in part, in software.

While various embodiments of a clock recovery enhancement circuit, according to the present invention, have been described hereinabove, the scope of the invention is defined by the following claims.

What is claimed is:

1. In a receiver having means for receiving a data signal at data rate $f_d$, the data signal having data edges, the receiver having means for forming a recovered clock signal from the data signal, the recovered clock signal having edges, a method for adjusting the recovered clock signal so as to keep the recovered clock signal edge aligned in time with the corresponding data signal edge, comprising the following steps:
   (a) detecting successive data edges of the data signal;
   (b) for each detected data edge detected as in step (a):
     (1) determining whether the detected data edge is early or late with respect to the corresponding edge of the recovered clock signal; and,
     (2) if the detected data edge is early, then accelerating the recovered clock signal by a recovery adjustment unit of time and, if the detected data edge is late, then retarding the recovered clock signal by a like amount of time;
   (c) for each recovered clock signal edge, generating a window signal having a predetermined time duration;

(d) detecting when a data edge occurs during the duration of the window signal;

(e) when step (d) occurs, then with respect to the next data edge:
  (1) determining, whether the data edge is late or early with respect to the recovered clock signal;
  (2) determining whether the late/early condition so determined is opposite to the late/early condition determined for the earlier or preceding data edge, as in step (b)(1); and,
  (3) when step (e)(2) occurs, then disabling the accelerating or retarding step, as in step (b)(2), for the data edge.

2. The method of claim 1 where the lower bound of the predetermined time duration of the window signal is based on the recovery adjustment unit of time.

3. The method of claim 2 where the upper bound of the predetermined time duration of the window signal is based on one-half the period of the data rate $f_d$.

4. A receiver having means for receiving a data signal at data rate $f_d$, the data signal having data edges, the receiver having means for forming a recovered clock signal from the data signal, the recovered clock signal having edges, the receiver having means for adjusting the recovered clock signal so as to keep the recovered clock signal edge aligned in time with the corresponding data signal edge, comprising:

means for detecting successive data edges of the data signal;

with respect to each detected data edge,
  means for determining whether the detected data edge is early or late with respect to the corresponding edge of the recovered clock signal; and,
  adjusting means for, if the detected data edge is early, then accelerating the recovered clock signal by a recovery adjustment unit of time and, if the detected data edge is late, then retarding the recovered clock signal by a like amount of time;

with respect to each recovered clock signal edge, means for generating a window signal having a predetermined time duration;

means for detecting when a data edge occurs during the duration of the window signal, and when a data edge occurs during the duration of the window signal, then with respect to the next data edge:
  means for determining, whether the data edge is late or early with respect to the recovered clock signal;
  means for determining whether the late/early condition so determined is opposite to the late/early condition determined for the earlier or preceding data edge; and,
  when the late/early condition so determined is opposite to the late/early condition determined for the earlier or preceding data edge, means for then disabling the adjusting means.

5. The receiver of claim 4 where the lower bound of the predetermined time duration of the window signal is based on the recovery adjustment unit of time.

6. The receiver of claim 5 where the upper bound of the predetermined time duration of the window signal is based on one-half the period of the data rate $f_d$.

7. A receiver having means for receiving a data signal at data rate $f_d$, the data signal having data edges, the receiver having means for forming a recovered clock signal from the data signal, the recovered clock signal having edges, the receiver arranged for adjusting the recovered clock signal so as to keep the recovered clock signal edge aligned in time with the corresponding data signal edge in accordance with a method comprising the following steps:

(a) detecting successive data edges of the data signal;

(b) for each detected data edge detected as in step (a):
  (1) determining whether the detected data edge is early or late with respect to the corresponding edge of the recovered clock signal; and,
  (2) if the detected data edge is early, then accelerating the recovered clock signal by a recovery adjustment unit of time and, if the detected data edge is late, then retarding the recovered clock signal by a like amount of time;

(c) for each recovered clock signal edge, generating a window signal having a predetermined time duration;

(d) detecting when a data edge occurs during the duration of the window signal;

(e) when step (d) occurs, then with respect to the next data edge:
  (1) determining, whether the data edge is late or early with respect to the recovered clock signal;
  (2) determining whether the late/early condition so determined is opposite to the late/early condition determined for the earlier or preceding data edge, as in step (b)(1); and,
  (3) when step (e)(2) occurs, then disabling the accelerating or retarding step, as in step (b)(2), for the data edge.

8. The receiver of claim 7 where the lower bound of the predetermined time duration of the window signal is based on the recovery adjustment unit of time.

9. The receiver of claim 8 where the upper bound of the predetermined time duration of the window signal is based on one-half the period of the data rate $f_d$.

10. A receiver having means for receiving a data signal at data rate $f_d$, the data signal having data edges, the receiver having means for forming a recovered clock signal from the data signal, the recovered clock signal having edges, the receiver having a processor programmed for adjusting the recovered clock signal so as to keep the recovered clock signal edge aligned in time with the corresponding data signal edge in accordance with an algorithm comprising the following steps:

(a) detecting successive data edges of the data signal;

(b) for each detected data edge detected as in step (a):
  (1) determining whether the detected data edge is early or late with respect to the corresponding edge of the recovered clock signal; and,
  (2) if the detected data edge is early, then accelerating the recovered clock signal by a recovery adjustment unit of time and, if the detected data edge is late, then retarding the recovered clock signal by a like amount of time;

(c) for each recovered clock signal edge, generating a window signal having a predetermined time duration;

(d) detecting when a data edge occurs during the duration of the window signal;

(e) when step (d) occurs, then with respect to the next data edge:
  (1) determining, whether the data edge is late or early with respect to the recovered clock signal;

(2) determining whether the late/early condition so determined is opposite to the late/early condition determined for the earlier or preceding data edge, as in step (b)(1); and, (3) when step (e)(2) occurs, then disabling the accelerating or retarding step, as in step (b)(2), for the data edge.

11. The receiver of claim 10 where the lower bound of the predetermined time duration of the window signal is based on the recovery adjustment unit of time.

12. The receiver of claim 11 where the upper bound of the predetermined time duration of the window signal is based on one-half the period of the data rate $f_d$.

* * * * *